Oct. 7, 1969 B. W. NUTTING ET AL 3,471,789

SINGLE PULSE SWITCH LOGIC CIRCUIT

Filed Feb. 15, 1967

INVENTORS.
BRUCE W. NUTTING
MILTON H. BOZARTH JR.

BY Edward J. Feeney Jr.

ATTORNEY

United States Patent Office 3,471,789
Patented Oct. 7, 1969

3,471,789

SINGLE PULSE SWITCH LOGIC CIRCUIT

Bruce W. Nutting, West Chester, and Milton H. Bozarth, Jr., Secane, Pa., assignors to Burroughs Corporation, Detroit, Mich., a corporation of Michigan Filed Feb. 15, 1967, Ser. No. 616,304
Int. Cl. H03k 3/04, 1/00
U.S. Cl. 328—63 8 Claims

ABSTRACT OF THE DISCLOSURE

The present application discloses a logical circuit for providing a single noisefree output pulse of one clock-time duration upon receipt of a single input signal from a switch or pushbutton. The pulse so generated is in synchronism with an associated clock signal.

BACKGROUND OF THE INVENTION

Field of the invention

Single pulses of one clock-time duration are often required to synchronize external input signals to digital computer systems. Such pulses are usually generated by the use of several circuits in combination, commonly known in the electronic-digital computer art as "single-shots" and "flip-flops." It is therefore one object of the present invention to provide a logical switching circuit capable of supplying a single noise-free output pulse. It may use a number of circuit types. For example, they may be of the types well known in the art as RTL, or DTC or TTL etc. They can be either of the type known as negative logic NAND circuits or positive logic NOR circuits. The circuits may be comprised of components known in the art as integrated circuit elements. An example of these circuits might be the well-known "Micrologic" circuitry, manufactured by the Fairchild Corporation.

Prior art

In the prior art, circuits which were capable of producing a single output pulse, having a one clock-time duration, often included a number of flip-flops in conjunction with a plurality of single shots. Further, when such a circuit was required to supply a noisefree output pulse additional circuitry was required. In some cases, this additional circuitry was in the form of noise signal filters. An example of this latter prior art is set forth in the U.S. Patent No. 3,193,697 issued to C. R. Cogar et al. on July 6, 1965 and entitled Synchronized Single Pulser which clearly illustrates and repeatedly notes the need for such filters.

SUMMARY OF THE INVENTION

The present invention is a logical circuit for providing a single noisefree output pulse which includes a gate circuit, an output flip-flop circuit and an asynchronous latching flip-flop circuit. The latching circuit is a self-sustaining configuration and is connected in the nature of a feedback circuit between the output flip-flop circuit and the gate circuit. In this manner, the gate circuit is held in its original condition by the action of the feedback flip-flop circuit until the manually activated switch arm applies another corresponding signal to the gate. The arrival of this second signal activates the gate and the gate applies an appropriate signal to the output flip-flop which thereafter awaits a first clock signal. The arrival of the clock signal activates the output flip-flop and a noisefree output pulse is initiated. The output pulse is terminated by the arrival of the next clock signal to provide an output pulse having a duration of one clock time. Activation of the output flip-flop also provides a signal to the feedback flip-flop which, in turn, applies a feedback signal to the input of the gate circuit.

Thus, the disclosed circuit provides a means for obtaining a single one-clock time pulse from a switch or pushbutton input. Such pulses are often required to synchronize external inputs to digital systems, and are normally generated by the use of several single-shots and flip-flops. Thus, the circuit described uses only negative logic NAND circuits (or positive logic NOR circuits) which may be of the RTL, the DTC, the TTL or any of many other well-known types.

BRIEF DESCRIPTION OF THE DRAWINGS

These and other objects and advantages of the invention will become more readily apparent by reviewing the following description in conjunction with the attached figures, in which.

DESCRIPTION OF THE PREFERRED EMBODIMENT

Figure 1:
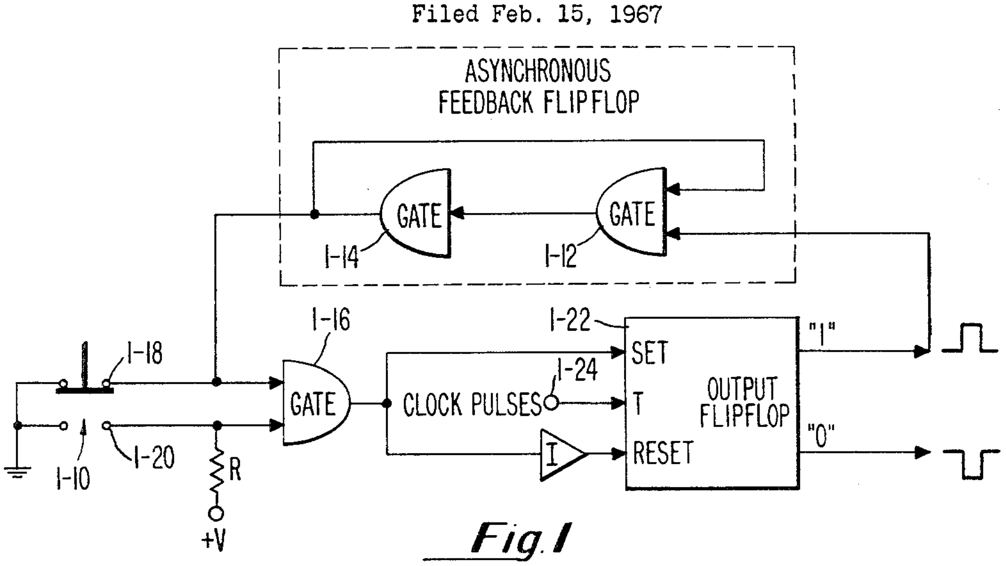
FIGURE 1 is a logical block diagram of one embodiment of the present invention.

Referring now to FIGURE 1, there is shown a circuit which operates in the following manner.

Switch 1–10 is normally in a position such that terminal 1–18 is held at ground. The terminal 1–20 is held positive by the resistor R. Thus, the output of gate 1–16 will be ground, and the flip-flop 1–22 will remain in the state whereby its "1" output is at ground and its "0" output (single pulse) is positive. The asynchronous flip-flop formed by gates 1–12 and 1–14 is held in a state such that the output of gate 1–14 is at ground (negative) and the output of gate 1–12 is positive.

When switch 1–10 is operated, it releases terminal 1–18 from ground. The terminal 1–18 remains at ground, however, because of the asynchronous flip-flop action of gates 1–12 and 1–14.

When the switch 1–10 contact arm reaches terminal 1–20 this point is grounded, thus presenting a ground potential at both terminals 1–18 and 1–20. This correspondence produces a positive signal at the output of gate 1–16.

The next clock pulse to arrive at terminal 1–24 will cause the flip-flop 1–22 to change state such that its "1" output is positive and its "0" output (single pulse) is at ground.

The positive output signal from the "1" side of flip-flop 1–22 will cause the output gate 1–12 to produce a ground output. This ground level signal will cause the output of gate 1–14 to become positive, which latches the asynchronous flip-flop (gates 1–12 and 1–14) by holding gate 1–12 in the state where its output is at ground level.

The positive output from gate 1–14 will cause a ground level output from gate 1–16. The next clock pulse applied to terminal 1–24 will cause the flip-flop 1–22 to return to its original state ("1" output at ground). No further action will occur because the asynchronous flip-flop (gates 1–12 and 1–14) will maintain a positive input to gate 1–16, causing its output to remain at ground.

When the switch 1–10 is released, terminal 1–20 returns to the positive state because of the resistor R connection to a positive potential. This input will maintain the output of gate 1–16 in the ground state. When the switch 1–10 has been fully released, terminal 1–18 will be grounded, returning the circuit to its original state and preparing it for another cycle.

An important feature to note is that the circuit will function regardless of any switch noise since only the first ground level state of terminal 1–20 which occurs at a clock time will be significant. No further actions will affect the circuit until the switch is fully released (terminal 1–18 is grounded). It should also be noted that the output pulse (positive or negative depending on which side of the flip-flop is used) will be limited in length to one clock-time because of the inhibiting action of the gate circuit.

Figure 2:
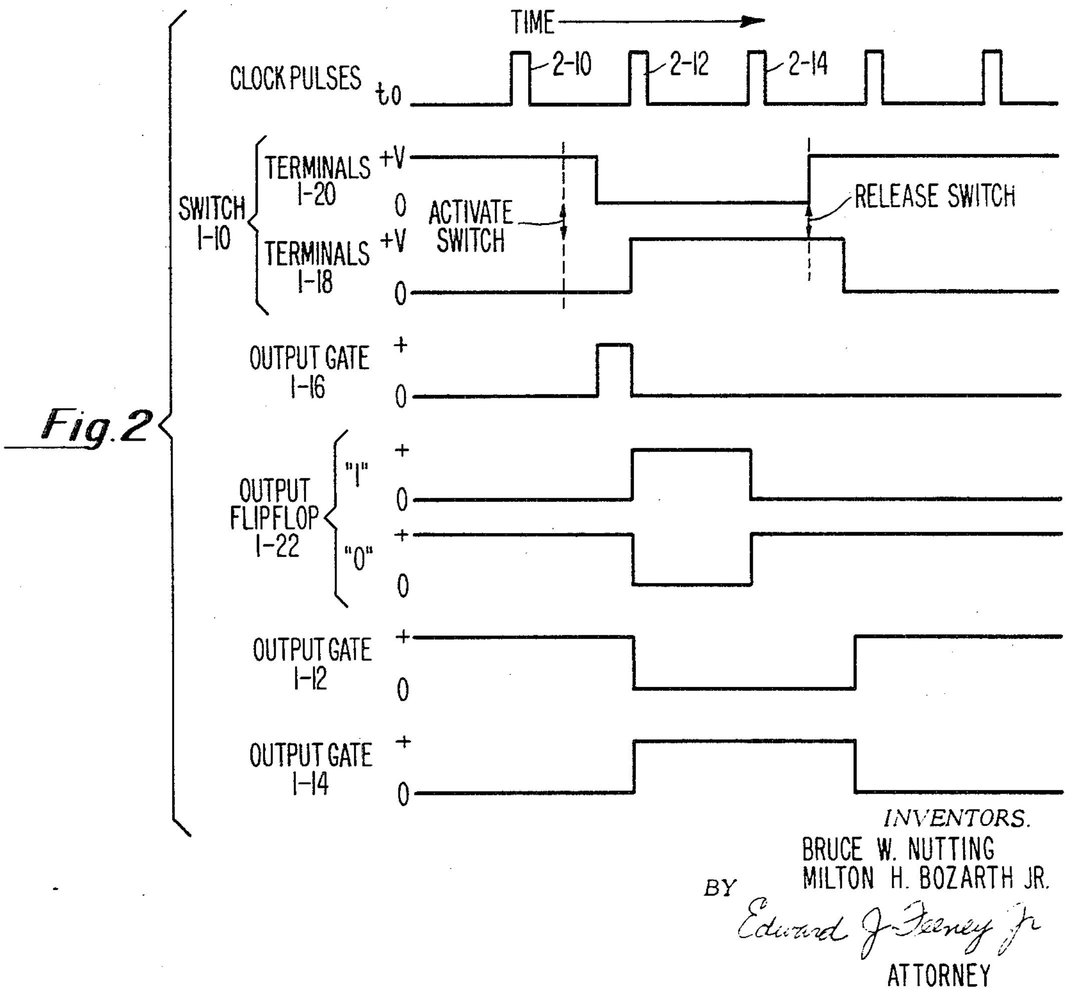
FIGURE 2 is a timing diagram for the embodiment illustrated in FIGURE 1.

To more fully appreciate the circuit action, a timing diagram of the circuit operation just described is illustrated in FIGURE 2. More specifically, the operation of each of the gates is shown by the waveforms at various times. Thus, at time $t_0$ the switch 1–10 has the voltages shown at its terminals 1–18 and 1–20 as ground or zero potential and the positive potential +V respectively. At some later time *t*, it is noted that the switch 1–10 is activated. However it is seen that the voltage on terminal 1–18 does not change from the ground potential. Similarly, since the manual action requires some time for the switch arm to reach the terminal 1–20, this terminal also does not change its potential level immediately. A short time later, however, the positive potential previously applied to terminal 1–20 by the resistor R is grounded by the action of the switch, but the zero potential applied to the terminal 1–18 by the action of gate 1–14 remains constant.

The simultaneous presence of a pair of zero potential levels to the input terminals of the gate 1–16 causes the gate output level to become positive. When this positive signal is applied to the flip-flop 1–22 in conjunction with clock pulse 2–12, the flip-flop is activated and the output levels are reversed. Thus, the "1" output which was previously at ground level rises to a positive potential. Conversely, the "0" output which was previously at a positive potential is grounded.

The positive signal output from the "1" side of the flip-flop 1–22 is returned to gate 1–12 and consequently as shown in the figure its output goes negative. The asynchronous action of the flip-flop formed by gates 1–12 and 1–14 causes the output of gate 1–14 to become positive at this time. This positive signal from gate 1–14 is returned to the input of gate 1–12 and its presence latches the asynchronous flip-flop to hold gate 1–12 in the condition where its output remains at ground potential.

What has been shown and described is one embodiment of a circuit which will produce a single-pulse output signal. This signal has a duration which is equivalent to a timing pulse signal duration and the pulse is synchronized therewith. Many uses may be found for such a circuit and the illustrative embodiment is not considered to be restrictive. Consequently, variations in the elements and components which comprise this disclosure may be substituted without exceeding the scope of this invention, which is only confined by the scope of the following claims.

What is claimed is:

1. A single pulse switch logic circuit capable of producing a single noisefree output pulse, of one clock-time duration, in response to an input signal from a manually operated switch, said logic circuit comprising a gate circuit, an output flip-flop circuit and a feedback flip-flop circuit, said gate circuit connected to the manually operated switch to receive the input pulse, and said gate circuit, in turn, connected to said output flip-flop circuit with said feedback flip-flop circuit connected between said output flip-flop circuit and said gate circuit to thereby provide from said output flip-flop circuit a single noisefree pulse, of one clock-time duration, in response to each activation of the manually operated switch.

2. The single pulse switch logic circuit as set forth in claim 1 above wherein said feedback flip-flop circuit is comprised of a first and a second gate circuit sequentially connected one to another to provide asynchronous operation.

3. The single pulse switch logic circuit as set forth in claim 2 wherein each of said first and said second gate circuits of the feedback flip-flop circuit is comprised of an OR gate.

4. A single pulse switch logic circuit comprising a manually operated switch, a gate circuit having an input means and an output means, an output flip-flop circuit having an input means and an output means, said gate circuit having its input means connected to said switch and its output means connected to the input means of said output flip-flop circuit and a feedback flip-flop circuit having a feedback input means connected to said output flip-flop circuit output means and a feedback output means connected to the input means of said gate circuit.

5. The single pulse switch logic circuit set forth in claim 4 wherein the input means of the output flip-flop circuit includes a clock timing means, a setting means and a resetting means.

6. The single pulse switch logic circuit as set forth in claim 5 wherein the resetting means of the output flip-flop circuit includes an inverter circuit.

7. A single pulse switch logic circuit capable of producing a single noisefree output pulse, of one clock time duration, in response to an input signal from a manually operated switch, said logic circuit comprising a gate circuit, an inverter circuit, an output flip-flop circuit and a feedback flip-flop circuit, said gate circuit connected to the manually operated switch to receive the input pulse, and said gate circuit, in turn, connected to said output flip-flop circuit directly and through said inverter circuit, with said feedback flip-flop circuit connected between said output flip-flop circuit and said gate circuit to thereby provide from said output flip-flop circuit a single noisefree pulse, of one clock time duration, in response to each activation of the manually operated switch.

8. The single pulse switch logic circuit as set forth in claim 7 wherein said output flip-flop circuit includes a setting and a resetting means and said inverter circuit is converted to said resetting means.

References Cited

UNITED STATES PATENTS

| | | | |
|---|---|---|---|
| 2,864,007 | 12/1958 | Clapper | 307—255 |
| 3,088,041 | 4/1963 | Hinkein et al. | 307—269 X |
| 3,124,705 | 3/1964 | Gray | 307—208 |
| 3,134,028 | 5/1964 | Jensen | 307—260 |
| 3,193,697 | 7/1965 | Cogar et al. | 307—269 X |

JOHN S. HEYMAN, Primary Examiner

STANLEY D. MILLER, Assistant Examiner

U.S. Cl. X.R.

307—208, 215, 265, 268, 269; 328—57, 92